United States Patent
Shi et al.

(10) Patent No.: US 11,177,324 B2
(45) Date of Patent: Nov. 16, 2021

(54) DISPLAY COMPONENT, DISPLAY DEVICE AND DISPLAY CONTROL METHOD

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Lingyun Shi, Beijing (CN); Xue Dong, Beijing (CN); Wei Sun, Beijing (CN); Xiaochuan Chen, Beijing (CN); Shengji Yang, Beijing (CN); Bo Gao, Beijing (CN); Zijiao Xue, Beijing (CN); Tiankuo Shi, Beijing (CN); Yafei Li, Beijing (CN); Yan Li, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 80 days.

(21) Appl. No.: 15/781,614

(22) PCT Filed: Nov. 2, 2017

(86) PCT No.: PCT/CN2017/109059
§ 371 (c)(1),
(2) Date: Jun. 5, 2018

(87) PCT Pub. No.: WO2018/099236
PCT Pub. Date: Jun. 7, 2018

(65) Prior Publication Data
US 2018/0358415 A1 Dec. 13, 2018

(30) Foreign Application Priority Data
Nov. 29, 2016 (CN) .......................... 201611072432.9

(51) Int. Cl.
*G09G 3/3258* (2016.01)
*H01L 27/32* (2006.01)
(Continued)

(52) U.S. Cl.
CPC ........ *H01L 27/3211* (2013.01); *G09G 3/3233* (2013.01); *G09G 3/3258* (2013.01);
(Continued)

(58) Field of Classification Search
CPC .......................... G09G 3/3233; G09G 3/3258
(Continued)

(56) References Cited

U.S. PATENT DOCUMENTS

2006/0158420 A1* 7/2006 Chang ................. G09G 3/3688
345/100
2012/0044447 A1* 2/2012 Yoshida ............... G09G 3/3648
349/139
(Continued)

FOREIGN PATENT DOCUMENTS

CN 101943830 A 1/2011
CN 103258512 A 8/2013
(Continued)

OTHER PUBLICATIONS

International Search Report of PCT/CN2017/109059 in Chinese, dated Jan. 26, 2018 with English translation.
(Continued)

*Primary Examiner* — Dennis P Joseph
(74) *Attorney, Agent, or Firm* — Collard & Roe, P.C.

(57) ABSTRACT

A display component, a display device and a display control method are provided. The display component includes a plurality of sub-pixel units arranged in a matrix; an inter-transmission connection portion; and a control portion, wherein each sub pixel unit includes a storage capacitor and an inter-transmission switching element, in each sub-pixel
(Continued)

unit, the storage capacitor is connected to the inter-transmission connection portion via the inter-transmission switching element, the control portion is configured to execute at least one inter-transmission operation in one frame period.

19 Claims, 4 Drawing Sheets

(51) Int. Cl.
*G09G 3/3233* (2016.01)
*H01L 51/52* (2006.01)

(52) U.S. Cl.
CPC .... *H01L 51/5203* (2013.01); *G02F 2201/121* (2013.01); *G02F 2201/123* (2013.01); *H01L 27/3265* (2013.01)

(58) Field of Classification Search
USPC .......................................................... 345/76
See application file for complete search history.

(56) References Cited

U.S. PATENT DOCUMENTS

| | | | |
|---|---|---|---|
| 2016/0070148 A1* | 3/2016 | Kimura | G02F 1/13624 349/43 |
| 2016/0189586 A1 | 6/2016 | Zou et al. | |

FOREIGN PATENT DOCUMENTS

| | | |
|---|---|---|
| CN | 104575353 A | 4/2015 |
| CN | 105654903 A | 6/2016 |
| CN | 106448552 A | 2/2017 |

OTHER PUBLICATIONS

Notice of Transmittal of the International Search Report of PCT/CN2017/109059 in Chinese, dated Jan. 26, 2018.

Written Opinion of the International Searching Authority of PCT/CN2017/109059 in Chinese, dated Jan. 26, 2018 with English translation.

* cited by examiner

DISPLAY COMPONENT, DISPLAY DEVICE AND DISPLAY CONTROL METHOD

CROSS REFERENCE TO RELATED APPLICATIONS

This application is the National Stage of PCT/CN2017/109059 filed on Nov. 2, 2017, which claims priority under 35 U.S.C. § 119 of Chinese Application No. 201611072432.9 filed on Nov. 29, 2016, the disclosure of which is incorporated by reference.

TECHNICAL FIELD

Embodiments of the present disclosure relate to a display component, a display device and a display control method.

BACKGROUND

In a Virtual Reality (VR) display system environment, display images in many scenes are switched on the basis of movement directions of eyeballs and a head, realizing operations such as translation, zooming in and zooming out of the images.

SUMMARY

An embodiment of the present disclosure provides a display component, including: a plurality of sub-pixel units arranged in a matrix; an inter-transmission connection portion; and a control portion, wherein each sub-pixel unit includes a storage capacitor and an inter-transmission switching element, in each sub-pixel unit, the storage capacitor is connected to the inter-transmission connection portion via the inter-transmission switching element, the control portion is configured to execute at least one inter-transmission operation in one frame period, and each inter-transmission operation includes: selecting at least one sub-pixel unit as a first inter-transmission unit; selecting at least another one sub-pixel unit as a second inter-transmission unit; controlling the storage capacitor of the at least one sub-pixel unit selected as the first inter-transmission unit to discharge; and simultaneously turning on the inter-transmission switching elements of the sub-pixel units selected as the first inter-transmission unit and the second inter-transmission unit, so that the storage capacitor of the at least another one sub-pixel unit selected as the second inter-transmission unit charges the storage capacitor of the at least one sub-pixel unit selected as the first inter-transmission unit by the inter-transmission connection portion to have a first voltage.

In an example, the control portion is configured to execute the selecting at least one sub-pixel unit as the first inter-transmission unit and the selecting at least another one sub-pixel unit as the second inter-transmission unit by performing analysis on a frame image signal of the one frame period and a frame image signal of a previous frame period adjacent to the one frame period, wherein a sub-image displayed in the previous frame period of the one frame period by the second inter-transmission unit and a sub-image displayed in the one frame period by the first inter-transmission unit belong to a same position of a same pattern.

In an example, the display component further includes an adjusting unit, the control portion being further configured to adjust the storage capacitor of the at least one sub-pixel unit selected as the first inter-transmission unit by the adjusting unit to have a second voltage.

In an example, the adjusting unit is provided with an input terminal and an output terminal, the input terminal is connected to the control portion, and the output terminal is directly connected to the inter-transmission connection portion.

In an example, a number of the at least one sub-pixel unit selected as the first inter-transmission unit is N, and a number of the at least another one sub-pixel unit selected as the second inter-transmission unit is 1, wherein $V2=V1\times(N+1)$, where V1 represents the first voltage, V2 represents the second voltage, and N is a natural number.

In an example, the plurality of sub-pixel units are formed on a base substrate, and the base substrate is a monocrystalline silicon chip.

In an example, each sub-pixel unit further includes a driving transistor and an Organic Light-Emitting Diode (OLED) element, the driving transistor is connected to the OLED element, and the storage capacitor is configured to maintain a gate voltage of the driving transistor.

In an example, the control portion is further configured to execute a charging and/or discharging operation on the storage capacitors of the sub-pixel units which are not selected as the first inter-transmission unit by the at least one inter-transmission operation in the one frame period.

In an example, the control portion is further configured to control charge or discharge of the storage capacitor of each sub-pixel unit in a point-to-point manner.

Another embodiment of the present disclosure provides a display device, including the display component described above.

Yet another embodiment of the present disclosure provides a display control method of a display device, wherein the display device includes a plurality of sub-pixel units arranged in a matrix and an inter-transmission connection portion, wherein each sub-pixel unit includes a storage capacitor and an inter-transmission switching element, and in each sub-pixel unit, the storage capacitor is connected to the inter-transmission connection portion via the inter-transmission switching element, the display control method including: executing at least one inter-transmission operation in one frame period, each inter-transmission operation including: selecting at least one sub-pixel unit as a first inter-transmission unit; selecting at least another one sub-pixel unit as a second inter-transmission unit; controlling the storage capacitor of the at least one sub-pixel unit selected as the first inter-transmission unit to discharge; and simultaneously turning on the inter-transmission switching elements of the sub-pixel units selected as the first inter-transmission unit and the second inter-transmission unit, so that the storage capacitor of the at least another one sub-pixel unit selected as the second inter-transmission unit charges the storage capacitor of the at least one sub-pixel unit selected as the first inter-transmission unit to have a first voltage.

In an example, the selecting at least one sub-pixel unit as the first inter-transmission unit and the selecting at least another one sub-pixel unit as the second inter-transmission unit are executed by analyzing a frame image signal of the one frame period and a frame image signal of a previous frame period adjacent to the one frame period, wherein a sub-image displayed in the previous frame period of the one frame period by the second inter-transmission unit and a sub-image displayed in the one frame period by the first inter-transmission unit belong to a same position of a same pattern.

In an example, each inter-transmission operation further includes: after simultaneously turning on the inter-transmission switching elements selected as the first inter-transmission unit and the second inter-transmission unit, adjusting the storage capacitor of the at least one sub-pixel unit selected as the first inter-transmission unit to have a second voltage.

In an example, a number of the at least one sub-pixel unit selected as the first inter-transmission unit is N, and a number of the at least another one sub-pixel unit selected as the second inter-transmission unit is 1, wherein $V2=V1\times(N+1)$, where V1 represents the first voltage, V2 represents the second voltage, and N is a natural number.

In an example, the display control method further includes: executing a charging and/or discharging operation on the storage capacitors of the sub-pixel units which are not selected as the first inter-transmission units by the at least one inter-transmission operation in the one frame period.

In an example, each sub-pixel unit further includes a driving transistor and an OLED element, a drain electrode of the driving transistor is connected to the OLED element, and the storage capacitor is configured to maintain a gate voltage of the driving transistor.

In an example, each inter-transmission operation further includes: after adjusting the storage capacitor of the at least one sub-pixel unit selected as the first inter-transmission unit to have the second voltage, maintaining the second voltage unmodified in remaining time of the one frame period.

BRIEF DESCRIPTION OF THE DRAWINGS

In order to clearly illustrate the technical solution of the embodiments of the disclosure, the drawings of the embodiments or description in the prior art will be briefly described in the following; it is obvious that the described drawings are only related to some embodiments of the disclosure and thus are not limitative of the disclosure.

DETAILED DESCRIPTION

The technical solution in the embodiments of the present disclosure will be described in a clearly and fully understandable way in connection with the drawings, and with reference to non-limiting exemplary embodiments shown in the drawings and described in detail in the descriptions below, the exemplary embodiments of the present disclosure and various characteristics and advantageous details thereof will be illustrated more comprehensively. It should be noted that the characteristics shown in the drawings are unnecessary to draw proportionally. Descriptions on known materials, components and process technologies are omitted so as not to make the exemplary embodiments of the present disclosure fuzzy. Examples merely aim to facilitate understanding implementation of the exemplary embodiments of the present disclosure and further enable those skilled in the art to implement the exemplary embodiments. Therefore, the examples should not be understood as limitations to the scope of the exemplary embodiments of the present disclosure.

Unless otherwise defined, the technical terms or scientific terms here should be of general meaning as understood by those ordinarily skilled in the art. In the present disclosure, words such as "first", "second" and the like do not denote any order, quantity, or importance, but rather are used for distinguishing different components. Words such as "up", "down", "left", "right" and the like are only used for expressing relative positional relationship, when the absolute position of a described object is changed, the relative positional relationship may also be correspondingly changed.

In a VR display system environment, a particularly large amount of data needs to be transmitted from an external data source to achieve a high resolution and a high refresh rate so as to improve subjective perception of a person with respect to switching of display images. Such a data transmission amount has approached or exceeded a limit of an existing transmission protocol.

Embodiments of the present disclosure provide a display device and a display control method, which can implement reduction of a transmission amount of external data by data transmission between sub-pixels so as to solve a problem of ultra-large-scale data transmission in a case of a high resolution and a high refresh rate.

Figure 1:
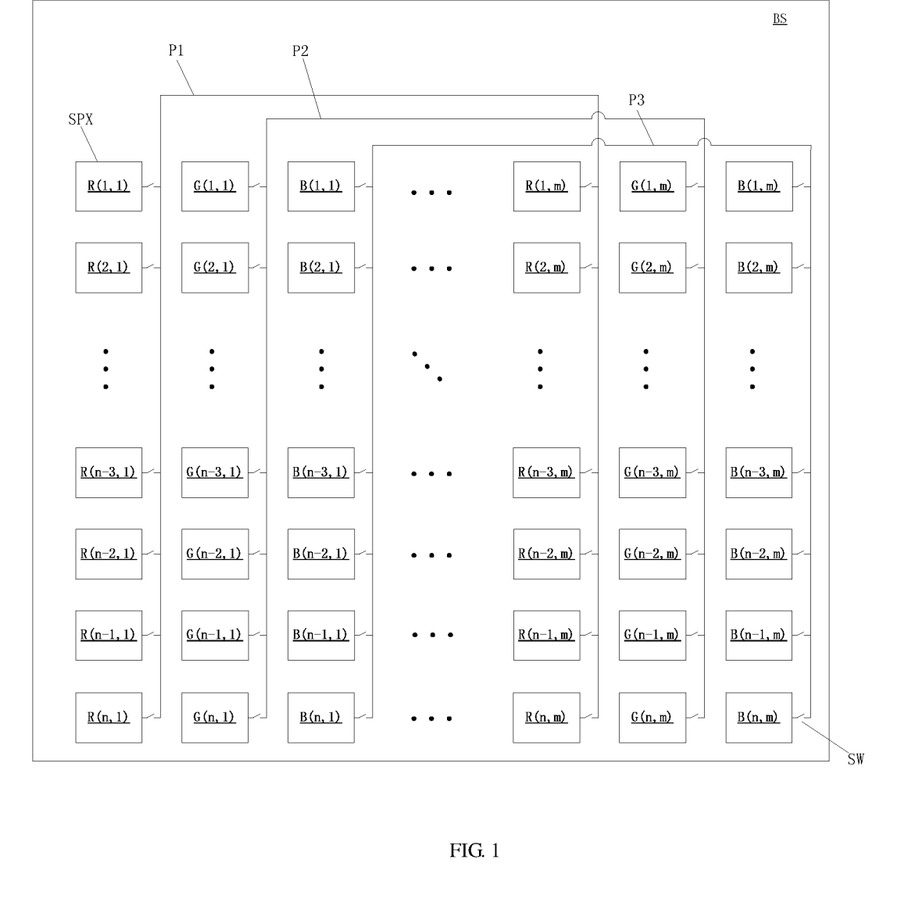
FIG. 1 shows a schematic diagram of layout of a plurality of sub-pixel units and a plurality of inter-transmission connection portions of a display component provided by an embodiment of the present disclosure.
Figure 2:
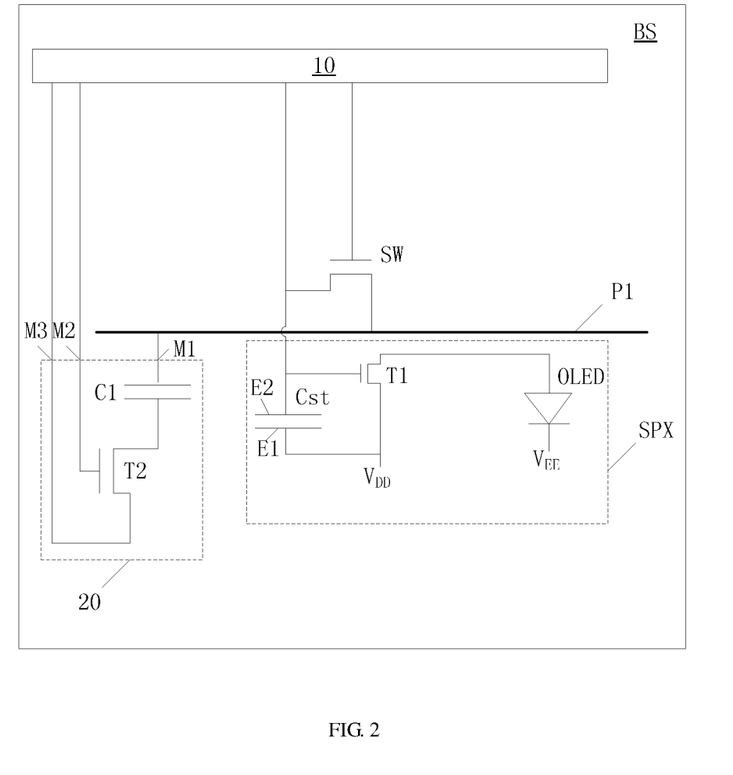
FIG. 2 shows a schematic diagram of constitution parts of a display component and a connection relationship thereof, as provided by an example of the embodiment of the present disclosure.

FIG. 1 shows a schematic diagram of layout of a plurality of sub-pixel units and a plurality of inter-transmission connection parts of a display component provided by an embodiment of the present disclosure. FIG. 2 shows a schematic diagram of respective constitution parts of a display component and a connection relationship thereof, as provided by an example of the embodiment of the present disclosure.

With reference to FIG. 1 and FIG. 2, the display component provided by the embodiment of the present disclosure is, for example, a display substrate, including a base substrate BS and a plurality of sub-pixel units, first to third inter-transmission connection portions P1 to P3, a control portion 10 and an adjusting portion 20 which are formed on the base substrate BS.

For example, the base substrate BS is a monocrystalline silicon wafer. It can be understood that the embodiment of the present disclosure does not limit a type of the base substrate, and for example, the base substrate BS can also be a glass substrate.

For example, the control portion 10 includes one or more Complementary Metal Oxide Semiconductor (CMOS) Integrated Circuits (ICs). The embodiment of the present disclosure does not limit a forming position of the control portion 10 either. For example, in the embodiment, the control portion 10 can be totally formed on the base substrate BS. For example, the control portion 10 is an IC, including a logic circuit positioned on the base substrate. The logic circuit is configured to convert digital information into a control signal to control each switch to be turned on/off. In another example, the control portion 10 can have a portion formed on the base substrate BS, and another portion formed outside the base substrate BS. In still another example, the control portion 10 may not be formed on the base substrate BS at all, and for example, the control portion 10 is communicatively connected with respective sub-pixel units SPX and/or a plurality of storage units ST in a wireless manner. With reference to FIG. 1, a plurality of sub-pixel units SPX are arranged in a matrix. The plurality of sub-pixel units SPX include a plurality of red sub-pixel units R (1, 1) to R (n, m) arranged in a matrix, a plurality of green sub-pixel units G (1, 1) to G (n, m) arranged in a matrix, and a plurality of blue sub-pixel units B (1, 1) to B (n, m) arranged in a matrix. The corresponding red sub-pixel unit R (x, y), green sub-pixel unit G (x, y) and blue sub-pixel unit B (x, y) form a pixel unit PX (x, y). For example, the red sub-pixel unit R (1, 1), the green sub-pixel unit G (1, 1) and the blue sub-pixel unit B (1, 1) form a pixel unit PX (1, 1). Herein, the former reference sign in the brackets represents a row number, and the latter reference sign in the brackets represents a column number.

As shown in FIG. 1, each of the red sub-pixel unit R (1, 1) to R (n, m) is connected to the first inter-transmission connection portion P1 via one inter-transmission switching element SW. In a case that the inter-transmission switching elements SW of any two red sub-pixels are turned on, the any two red pixels are communicated with each other via the first inter-transmission connection portion P1; and each of the green sub-pixel units G (1, 1) to G (n, m) is connected to the second inter-transmission connection portion P2 via one inter-transmission switching element SW. In a case that the inter-transmission switching elements SW of any two green sub-pixels are turned on, the any two green pixels are communicated with each other via the second inter-transmission connection portion P2; and each of the blue sub-pixel units B (1, 1) to B (n, m) is connected to the third inter-transmission connection portion P3 via one inter-transmission switching element SW. In a case that the inter-transmission switching elements SW of any two blue sub-pixels are turned on, the two random blue pixels are communicated with each other via the third inter-transmission connection portion P3. The first inter-transmission connection portion P1, the second inter-transmission connection portion P2 and the third inter-transmission connection portion P3 may include wires and through holes. Herein, that the inter-transmission switching element SW is turned on means that the inter-transmission switching element SW is in a state of allowing current to pass through the inter-transmission switching element SW. In contrast, that the inter-transmission switching element SW is turned off means that the inter-transmission switching element SW is in a state of not allowing a current to pass through the inter-transmission switching element SW.

FIG. 2 only schematically shows a connection relationship of one red sub-pixel unit and the first inter-transmission connection portion P1 as well as other portions of the display substrate. It can be understood that other red sub-pixel units can have a similar structure and connection relationship; the green sub-pixel unit can have a similar structure and can have a corresponding connection relationship with the second inter-transmission connection portion and other portions of the display substrate; and the blue sub-pixel unit can have a similar structure and may also have a corresponding connection relationship with the third inter-transmission connection portion and other portions of the display substrate.

With reference to FIG. 2, the sub-pixel unit SPX is an Organic Light-Emitting Diode (OLED) display sub-pixel unit, including a storage capacitor Cst, a driving transistor T1 and an OLED element. The storage capacitor Cst is configured to maintain a gate voltage of the driving transistor T1, so that the OLED element can continuously emit light. In the embodiment, a first electrode E1 of the storage capacitor Cst is electrically connected to a gate electrode of the driving transistor T1, and a second electrode E2 of the storage capacitor Cst is connected to a source electrode of the driving transistor T1. For example, the storage capacitors of respective sub-pixel units connected to the same inter-transmission connection portion have the same capacitance.

The control portion 10, for example, is configured to provide a signal (for example, an analog voltage signal) to the respective sub-pixel unit to charge the storage capacitor Cst therein so as to drive the corresponding OLED element to emit light. Further, the control portion 10, for example, is configured to directly provide a signal (for example, a voltage signal) to each sub-pixel unit to discharge the storage capacitor Cst therein. In the embodiment, the control portion 10, for example, is configured to control charging and discharging of the storage capacitors of the plurality of sub-pixel units in a point-to-point manner. Namely, the storage capacitor of each sub-pixel unit can independently be charged and discharged regardless of charging or discharging of storage capacitors of other sub-pixel units.

For example, in FIG. 2, the control portion 10 provides an electrical signal to the red sub-pixel unit SPX to charge the storage capacitor Cst. When a voltage between the two electrodes of the storage capacitor Cst exceeds a certain threshold, the driving transistor T1 is turned on, and the current can flow through the OLED element so as to enable the OLED element to emit light; and in a case that the control portion 10 stops providing the electrical signal to the storage capacitor Cst, the storage capacitor Cst can maintain the gate voltage of the driving transistor T1, and thus, the OLED element can continuously emit light in remaining time of one frame period. Herein, one frame period, for example, means time required for producing or displaying one frame of image.

In the embodiment, the inter-transmission switching element SW, for example, is a transistor (for example, a Metal Oxide Semiconductor (MOS) transistor). The first electrode of the storage capacitor Cst of the sub-pixel unit SPX is connected to the corresponding inter-transmission connection portion via the inter-transmission switching element SW. In FIG. 2, the first electrode of the storage capacitor Cst of the red sub-pixel unit SPX is connected to the first inter-transmission connection portion P1 via the inter-transmission switching element SW. The inter-transmission switching element SW is provided with a source electrode, a drain electrode and a gate electrode. For example, the source electrode of the inter-transmission switching element SW is connected to the first electrode of the storage capacitor, the drain electrode is connected to the first inter-transmission connection portion P1, and the gate electrode is connected to the control portion 10.

The control portion 10 is configured to provide the electrical signal (for example, the voltage signal) to the gate electrode of each inter-transmission switching element SW to turn on each inter-transmission switching element SW, so that the current can flow to the drain electrode from the source electrode of the inter-transmission switching element SW. It can be understood that in a case that the inter-transmission switching element SW is turned on, the current can also flow to the source electrode from the drain electrode of the inter-transmission switching element SW.

The adjusting portion 20 is configured to adjust a voltage between the first electrode and the second electrode of the storage capacitor Cst of the sub-pixel unit SPX. As shown in FIG. 2, the adjusting portion 20 includes a capacitor C1 and a transistor T2. In a state that the transistor T2 is turned on, a compensatory voltage signal Vcomp accepted by a source electrode of the transistor T2 can be stored into the capacitor C1, and one electrode of the capacitor C1, as an output terminal of the adjusting portion 20, is directly connected to the first inter-transmission connection portion P1. In a case that the inter-transmission switching element SW is turned on, the adjusting portion 20 can adjust the voltage between the two electrodes of the storage capacitor Cst of the sub-pixel unit SPX. In the embodiment, the control portion 10 is configured to adjust the voltage between the two electrodes of the storage capacitor Cst of each of the red sub-pixel units connected to the first inter-transmission connection portion P1 by the adjusting portion 20. The display substrate provided by the embodiment can further include another two adjusting portions (not shown) similar with the adjusting portion 20, which are respectively connected to the second inter-transmission connection portion P2 and the third inter-transmission connection portion P3. It can be understood that the embodiment of the present disclosure does not limit the number and a circuit structure of the adjusting portion. In another example, one adjusting portion can be provided for each sub-pixel unit.

Although one pixel unit includes three sub-pixel units in the above-mentioned embodiment, it can be understood that the number of the sub-pixel units included in one pixel unit is not limited in the embodiment of the present disclosure. For example, one pixel unit of a display substrate provided by an embodiment of the present disclosure can include one or four sub-pixel units. In a case that one pixel unit only includes one sub-pixel unit, the sub-pixel unit can be considered as the pixel unit.

Figure 3:
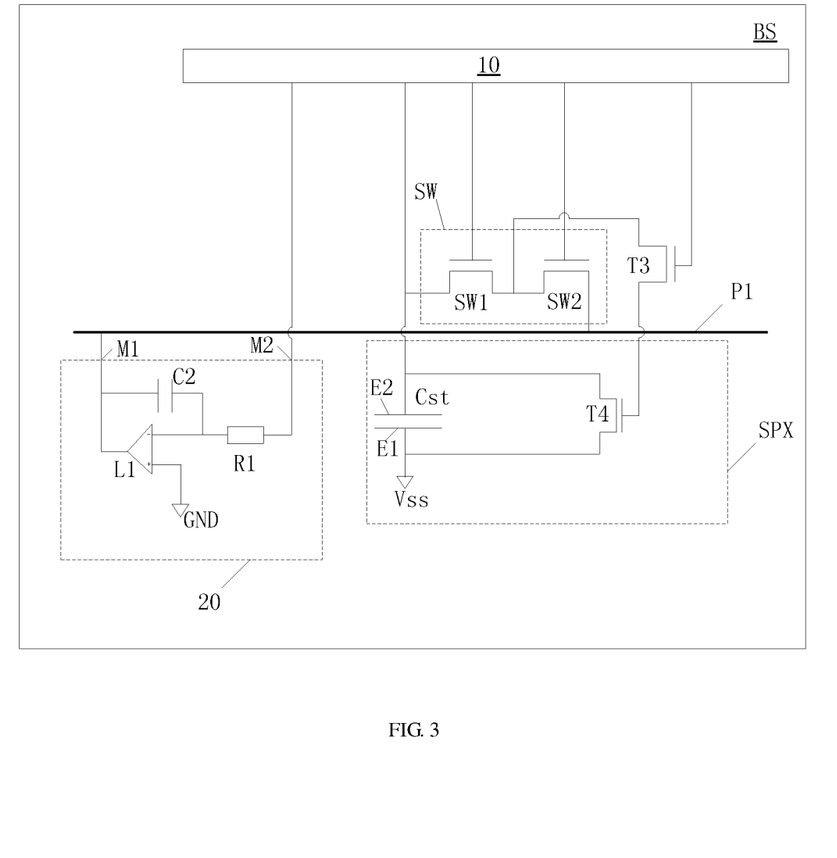
FIG. 3 shows a schematic diagram of constitution parts of a display component and a connection relationship thereof, as provided by another example of an embodiment of the present disclosure.

FIG. 3 shows a schematic diagram of respective constitution parts of a display component and a connection relationship thereof, as provided by another example of the embodiment of the present disclosure. In the embodiments shown in FIG. 2 and FIG. 3, the same reference signs represent the same or similar elements.

With reference to FIG. 3, the adjusting portion 20 includes a magnifier L1, a resistance element R1 and a capacitor C2. An output terminal M1 of the adjusting portion 20 is directly connected to the first inter-transmission connection portion P1, and input terminals M2 and M3 of the adjusting portion 20 are connected to the control portion 10.

As shown in FIG. 3, the inter-transmission switching element SW, for example, includes two transistors SW1 and SW2. Gate electrodes of the transistors SW1 and SW2 are respectively connected to the control portion 10. The control portion 10 is configured to turn on the inter-transmission switching element SW by providing signals to the gate electrodes of the transistors SW1 and SW2. For example, the control portion 10 is configured to simultaneously turn on the transistors SW1 and SW2 by respectively providing a row addressing signal and a column addressing signal to the transistors SW1 and SW2, so as to implement turning-on of the inter-transmission switching element SW.

In the example shown in FIG. 3, the sub-pixel unit SPX is, for example, a Liquid Crystal Display (LCD) sub-pixel unit, and includes the storage capacitor Cst. Herein, the first electrode E1 of the storage capacitor Cst is, for example, a pixel electrode, the second electrode E2 is, for example, a common electrode and/or a common electrode line. The storage capacitor Cst is configured to stabilize a written data voltage, i.e., a potential of a pixel electrode.

In the example shown in FIG. 3, the control portion 10 is configured to control the storage capacitor Cst in the sub-pixel SPX to discharge by a discharge control portion formed by transistors T3 and T4. For example, the control portion 10 provides the row addressing signal and the column addressing signal to a gate electrode of the transistor SW1 and a gate electrode of the transistor T3, so that the transistor SW1 and the transistor T3 are simultaneously turned on, and the transistor T4 is also turned on, thereby implementing discharging of the storage capacitor Cst.

In the above-mentioned embodiment, the inter-transmission switching element SW is shown outside a dotted box of the sub-pixel unit SPX, but due to that each sub-pixel unit SPX is equipped with one inter-transmission switching element SW, the inter-transmission switching element SW can also be considered as a portion of the sub-pixel unit SPX.

An embodiment of the present disclosure provides a display device, including the display component provided by any one of the above-mentioned embodiments. For example, the display device can be a silicon-based micro display device.

Another embodiment of the present disclosure provides a display control method of a display device. The display device, for example, includes the display component provided by any one of the above-mentioned embodiments.

Figure 4:
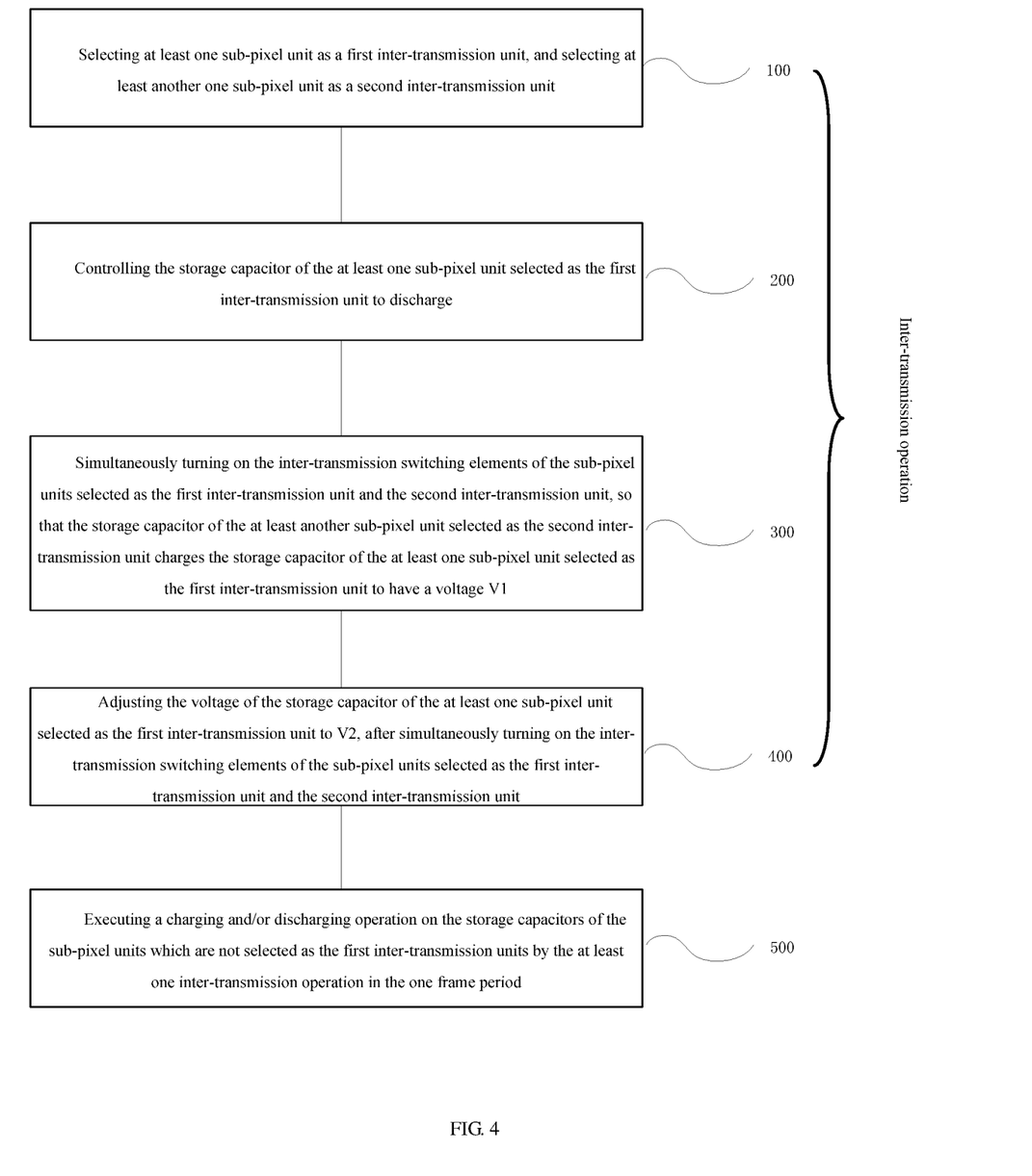
FIG. 4 shows a flow chart of a display control method of a display device, as provided by an embodiment of the present disclosure.

With reference to FIG. 4, the display control method includes: executing an inter-transmission operation at least one time in one frame period, each inter-transmission operation including:

S100: selecting at least one sub-pixel unit as a first inter-transmission unit, and selecting at least another one sub-pixel unit as a second inter-transmission unit;

S200: controlling the storage capacitor of the at least one sub-pixel unit selected as the first inter-transmission unit to discharge; and S300: simultaneously turning on the inter-transmission switching elements of the sub-pixel units selected as the first inter-transmission unit and the second inter-transmission unit, so that the storage capacitor of the at least another one sub-pixel unit selected as the second inter-transmission unit charges the storage capacitor of the at least one sub-pixel unit selected as the first inter-transmission unit to have a voltage V1.

The selecting at least one sub-pixel unit as the first inter-transmission unit and the selecting at least another one sub-pixel unit as the second inter-transmission unit are executed by carrying out analysis on a frame image signal of the one frame period and a frame image signal of a previous frame period adjacent to the one frame period, wherein a sub-image displayed in the previous frame period of the one frame period by the second inter-transmission unit and a sub-image displayed in the one frame period by the first inter-transmission unit belong to the same position of the same pattern.

For example, a first frame period is a previous frame period immediately adjacent to a second frame period. By analyzing a first frame of image signal of the first frame period and a second frame of image signal of the second frame period, it can be known that a second sub-image to be displayed in the second frame period by a plurality of sub-pixel units at a first position and a first sub-image to be displayed in the first frame period by a plurality of sub-pixel units at a second position have a same or similar pattern(s)), for example, a same or similar triangular shape. Herein, the first position is different from the second position; the similar patterns refer to that one pattern is a pattern obtained by zooming in or zooming out the other pattern in equal proportion. Then, the sub-pixel units at positions where a same portion of the same or similar pattern(s) is displayed within the first frame period and the second frame period can be respectively selected as the second inter-transmission unit and the first inter-transmission unit. For example, the sub-pixel unit at an upper vertex of a triangle to be displayed in the second frame period can be selected as the first inter-transmission unit, and the sub-pixel unit at the same upper vertex of the triangle to be displayed in the first frame period can be selected as the second inter-transmission unit. In addition, at least one of the information on the number of sub-pixel units that differs in a row direction and in a column direction between the first inter-transmission unit and the second inter-transmission unit, the information on proportion for zooming in or zooming out the similar pattern, and the information on the number of sub-pixel units of the same or similar pattern occupying in the row direction and in the column direction can also be obtained by the above-described analysis. In this way, in a case where the position information of the second inter-transmission unit is known, positioning of the first inter-transmission unit can be executed in combination with the at least one of the information described above.

For example, in the embodiment shown in FIG. 4, the display control method includes: executing one inter-transmission operation in one frame period.

For example, in a first case, sub-images at positions of sub-pixel units R (1, 1) and R (2, 1) in the first frame period need to be translated to positions of sub-pixel units R (n−1, m) and R (n, m) in the second frame period for display. Herein, the first frame period and the second frame period represent two adjacent frame periods, i.e., a time point when the first frame period ends is a time point when the second frame period starts. The display control method can include: executing two inter-transmission operations in the second frame period as follows.

The first inter-transmission operation includes:

Selecting the sub-pixel unit R (n−1, m) as the first inter-transmission unit, and selecting the sub-pixel unit R (1, 1) as the second inter-transmission unit.

Controlling the storage capacitor Cst of the sub-pixel unit R (n−1, m) selected as the first inter-transmission unit to discharge, i.e., making a voltage (i.e., a voltage between the two electrodes) of the storage capacitor Cst of the sub-pixel unit R (n−1, m) become basically 0V. In one example, with reference to FIG. 2, the control portion 10, for example, directly provides a discharge signal to the electrode E1 of the storage capacitor Cst of the sub-pixel unit R (n−1, m) so as to enable the storage capacitor Cst of the sub-pixel unit R (n−1, m) to discharge. In another example, with reference to FIG. 3, the control portion 10, for example, by respectively providing a row addressing signal and a column addressing signal to gate electrodes of the transistors SW1 and T3 of the sub-pixel unit R (n−1, m), makes the storage capacitor Cst of the sub-pixel unit R (n−1, m) to discharge via the transistor T4.

Simultaneously turning on the inter-transmission switching elements of the sub-pixel unit R (n−1, m) selected as the first inter-transmission unit and the sub-pixel unit R (1, 1) selected as the second inter-transmission unit, so that the storage capacitor Cst of the sub-pixel unit R (1, 1) selected as the second inter-transmission unit charges the storage capacitor Cst of the sub-pixel unit R (n−1, m) selected as the first inter-transmission unit to have the voltage V1. Herein, the case that the storage capacitor Cst of the sub-pixel unit R (n−1, m) is charged to have the voltage V1 means that the storage capacitor Cst of the sub-pixel unit R (n−1, m) is charged to have the voltage V1 between the two electrodes E1 and E2 of the storage capacitor Cst. For example, the storage capacitor Cst of the sub-pixel unit R (n−1, m) selected as the first inter-transmission unit and the storage capacitor Cst of the sub-pixel unit R (1, 1) selected as the second inter-transmission unit are connected in series. In one example, with reference to FIG. 2, the control portion 10, for example, directly provides addressing signals to the inter-transmission switching elements SW of the sub-pixel units R (1, 1) and R (n−1, m) so as to turn on the inter-transmission switching elements SW of the sub-pixel units R (1, 1) and R (n−1, m). In another example, with reference to FIG. 3, the control portion 10, for example, by respectively providing a row addressing signal and a column addressing signal to the gate electrodes of the transistors SW1 and SW2 of each of the sub-pixel units R (1, 1) and R (n−1, m), turns on the inter-transmission transistor SW of each of the sub-pixel units R (1, 1) and R (n−1, m). For example, when the first frame period ends, the voltage between the two electrodes of the storage capacitor Cst of the sub-pixel unit R (1, 1) selected as the second inter-transmission unit is 3V. After the storage capacitor Cst of the sub-pixel unit R (n−1, m) selected as the first inter-transmission unit discharges, the voltage between the two electrodes of the storage capacitor Cst is basically 0V. Simultaneously turn-on of the inter-transmission switching elements of the sub-pixel units R (1, 1) and R (n−1, m) enables the storage capacitors of the sub-pixel units R (1, 1) and R (n−1, m) to be connected in series via the first inter-transmission portion P1. The storage capacitor Cst of the sub-pixel unit R (1, 1) charges the storage capacitor Cst of the sub-pixel unit R (n−1, m) to have the voltage V1, and V1=1.5. Therefore, the voltage between the two electrodes of the storage capacitor of each of the sub-pixel units R (1, 1) and R (n−1, m) is 1.5V.

The second inter-transmission operation includes:

Selecting the sub-pixel unit R (n, m) as the first inter-transmission unit, and selecting the sub-pixel unit R (2, 1) as the second inter-transmission unit.

Controlling the storage capacitor Cst of the sub-pixel unit R (n, m) selected as the first inter-transmission unit to discharge, i.e., making the voltage of the storage capacitor Cst of the sub-pixel unit R (n, m) become basically 0V (volt).

Simultaneously turning on the inter-transmission switching elements of the sub-pixel unit R (n, m) selected as the first inter-transmission unit and the sub-pixel unit R (2, 1) selected as the second inter-transmission unit, so that the storage capacitor Cst of the sub-pixel unit R (2, 1) selected as the second inter-transmission unit charges the storage capacitor Cst of the sub-pixel unit R (n, m) selected as the first inter-transmission unit to enable the storage capacitor Cst of the sub-pixel unit R (n, m) to have the voltage V1. For example, when the first frame period ends, the voltage between the two electrodes of the storage capacitor Cst of the sub-pixel unit R (2, 1) selected as the second inter-transmission unit is 6V. After the storage capacitor Cst of the sub-pixel unit R (n, m) selected as the first inter-transmission unit discharges, the voltage between the two electrodes of the storage capacitor Cst is basically 0V. After the inter-transmission switching elements of the sub-pixel units R (2, 1) and R (n, m) are simultaneously turned on and the storage capacitors of the sub-pixel units R (2, 1) and R (n, m) are electrically communicated via the first inter-transmission portion P1, the voltage between the two electrodes of the storage capacitor of each of the sub-pixel units R (2, 1) and R (n, m) is 3V.

It should be noted that the first inter-transmission operation and the second inter-transmission operation are not carried out simultaneously so as to avoid inter-transmission signal crosstalk.

Therefore, by signal inter-transmission between sub-pixels, the sub-images at the positions of the sub-pixel units R (1, 1) and R (2, 1) in the first frame period are translated to the positions of the sub-pixel units R (n−1, m) and R (n, m) to display. Therefore, data signals which originally are to be written into the sub-pixel units R (n−1, m) and R (n, m) in the second frame period can be removed, so that the transmission amount of the external data is reduced, and the problem of ultra-large-scale data transmission in a case of a high resolution and a high refresh rate is solved. Herein, the external data, for example, means data outside the sub-pixels.

For example, in a second case, the sub-images at the positions of the sub-pixel units R (1, 1) and R (2, 1) in the first frame period need to be zoomed in to positions of the sub-pixel units R (n−3, m), R (n−2, m), R (n−1, m) and R (n, m) for display. The display control method can include: executing two inter-transmission operations in the second frame period as follows.

The first inter-transmission operation includes:

Selecting the sub-pixel units R (n−3, m) and R (n−2, m) as the first inter-transmission units, and selecting the sub-pixel unit R (1, 1) as the second inter-transmission unit;

discharging the storage capacitors Cst of the sub-pixel units R (n−3, m) and R (n−2, m) selected as the first inter-transmission units, i.e., making the voltage of the storage capacitor Cst of each of the sub-pixel units R (n−3, m) and R (n−2, m) become basically 0V (volt); and Simultaneously turning on the inter-transmission switching elements of the sub-pixel units R (n−3, m) and R (n−2, m) selected as the first inter-transmission units and the sub-pixel unit R (1, 1) selected as the second inter-transmission unit, so that the storage capacitor Cst of the sub-pixel unit R (1, 1) selected as the second inter-transmission unit charges the storage capacitors Cst of the sub-pixel units R (n−3, m) and R (n−2, m) selected as the first inter-transmission units to have the voltages V1. For example, when the first frame period ends, the voltage between the two electrodes of the storage capacitor Cst of the sub-pixel unit R (1, 1) selected as the second inter-transmission unit is 3V. After the storage capacitors Cst of the sub-pixel units R (n−3, m) and R (n−2, m) selected as the first inter-transmission units discharge, the voltage between the two electrodes of each storage capacitor Cst is basically 0V. After the inter-transmission switching elements of the sub-pixel units R (1, 1), R (n−3, m) and R (n−2, m) are simultaneously turned on and the storage capacitors of the sub-pixel units R (1, 1), R (n−3, m) and R (n−2, m) are electrically communicated via the first inter-transmission portion P1, and the voltage V1 between the two electrodes of the storage capacitor of each of the sub-pixel units R (1, 1), R (n−3, m) and R (n−2, m) is 1V.

The second inter-transmission operation includes:

Selecting the sub-pixel units R (n−1, m) and R (n, m) as the first inter-transmission units, and selecting the sub-pixel unit R (1, 1) as the second inter-transmission unit;

Discharging the storage capacitors Cst of the sub-pixel units R (n−1, m) and R (n, m) selected as the first inter-transmission units to, i.e., making the voltage of the storage capacitor Cst of each of the sub-pixel units R (n−1, m) and R (n, m) become basically 0V (volt); and Simultaneously turning on the inter-transmission switching elements of the sub-pixel units R (n−1, m) and R (n, m) selected as the first inter-transmission units and the sub-pixel unit R (2, 1) selected as the second inter-transmission unit, so that the storage capacitor Cst of the sub-pixel unit R (2, 1) selected as the second inter-transmission unit charges the storage capacitors Cst of the sub-pixel units R (n−1, m) and R (n, m) selected as the first inter-transmission units to have the voltages V1. For example, when the first frame period ends, the voltage between the two electrodes of the storage capacitor Cst of the sub-pixel unit R (2, 1) selected as the second inter-transmission unit is 6V. After the storage capacitors Cst of the sub-pixel units R (n−1, m) and R (n, m) selected as the first inter-transmission units discharge, the voltage between the two electrodes of each storage capacitor Cst is basically 0V. After the inter-transmission switching elements of the sub-pixel units R (2, 1), R (n−1, m) and R (n, m) are simultaneously turned on and the storage capacitors of the sub-pixel units R (2, 1), R (n−1, m) and R (n, m) are electrically communicated via the first inter-transmission portion P1, the voltage V1 between the two electrodes of the storage capacitor of each of the sub-pixel units R (2, 1), R (n−1, m) and R (n, m) is 2V.

Therefore, by signal inter-transmission between the sub-pixels, the sub-images at the positions of the sub-pixel units R (1, 1) and R (2, 1) in the first frame period are zoomed in to the positions of the sub-pixel units R (n−3, m), R (n−2, m), R (n−1, m) and R (n, m) for display. Therefore, data signals which originally are to be written into the sub-pixel units R (n−3, m), R (n−2, m), R (n−1, m) and R (n, m) in the second frame period can be removed, so that the transmission amount of the external data is reduced, and the problem of ultra-large-scale data transmission in a case of a high resolution and a high refresh rate is solved.

For example, in a third case, the sub-images at the positions of the sub-pixel units R (1, 1) and R (2, 1) in the first frame period need to be zoomed out to the position of the sub-pixel unit R (n, m) for display. The display control method can include: executing the inter-transmission operation in the second frame period as follows:

Selecting the sub-pixel unit R (n, m) as the first inter-transmission unit, and selecting the sub-pixel units R (1, 1) and R (2, 1) as the second inter-transmission units;

Discharging the storage capacitor Cst of the sub-pixel unit R (n, m) selected as the first inter-transmission unit to discharge, i.e., making the voltage of the storage capacitor Cst of the sub-pixel unit R (n, m) become basically 0V (volt); and Simultaneously turning on the inter-transmission switching elements of the sub-pixel unit R (n, m) selected as the first inter-transmission unit and the sub-pixel units R (1, 1) and R (2, 1) selected as the second inter-transmission units, so that the storage capacitors Cst of the sub-pixel units R (1, 1) and R (2, 1) selected as the second inter-transmission units charge the storage capacitor Cst of the sub-pixel unit R (n, m) selected as the first inter-transmission unit to have the voltage V1. For example, when the first frame period ends, the voltage between the two electrodes of the storage capacitor Cst of the sub-pixel unit R (1, 1) selected as the second inter-transmission unit is 2V, and the voltage between the two electrodes of the storage capacitor Cst of the sub-pixel unit R (2, 1) selected as the second inter-transmission unit is 4V. After the storage capacitor Cst of the sub-pixel unit R (n, m) selected as the first inter-transmission unit discharges, the voltage between the two electrodes of the storage capacitor Cst is basically 0V. After the inter-transmission switching elements of the sub-pixel units R (1, 1), R (2, 1) and R (n, m) are simultaneously turned on and the storage capacitors of the sub-pixel units R (1, 1), R (2, 1) and R (n, m) are electrically communicated via the first inter-transmission portion P1, the voltage V1 between the two electrodes of the storage capacitor of each of the sub-pixel units R (1, 1), R (2, 1) and R (n, m) is 3V.

Therefore, by signal inter-transmission between the sub-pixels, the sub-images at the positions of the sub-pixel units R (1, 1) and R (2, 1) in the first frame period are zoomed out to the position of the sub-pixel unit R (n, m) for display. Therefore, a data signal which originally is to be written into the sub-pixel unit R (n, m) in the second frame period can be removed, so that the transmission amount of the external data is reduced, and the problem of ultra-large-scale data transmission in a case of a high resolution and a high refresh rate is solved.

It can be understood that the embodiments of the present disclosure limit neither the number of the sub-pixel units selected as the first inter-transmission units, nor the number of the sub-pixel units selected as the second inter-transmission units.

In the display control method provided by the embodiment of the present disclosure, each inter-transmission operation, for example, after the step S300, further includes:

S400: adjusting the voltage of the storage capacitor of the at least one sub-pixel unit selected as the first inter-transmission unit to V2.

In one example, with reference to FIG. 2, the step S400 is implemented as follows. The control portion 10 sends signals to the input terminals M2 and M3 of the adjusting portion 20 so as to turn on the transistor T2 and provide an adjusting voltage to a capacitor C1 by the transistor T2. In a case that the inter-transmission switching element of the sub-pixel unit selected as the first inter-transmission unit is turned on, the adjusting voltage on the capacitor C1 can adjust the voltage of the storage capacitor Cst of the sub-pixel unit.

In another example, with reference to FIG. 3, the step S400 is implemented in a mode as follows. The control portion 10 sends a first signal representing the voltage of the storage capacitor of the sub-pixel unit selected as the first inter-transmission unit to the input terminal M2 of the adjusting portion 20, and the first signal can be amplified in a multiplying mode by operation of an integrating amplifier and output to the first inter-transmission connection portion P1 via the output terminal M1, so that the voltage of the storage capacitor of the corresponding sub-pixel unit can be adjusted.

For example, in the first case, by simultaneously turning on the inter-transmission switching elements of the sub-pixel units R (n−1, m) and R (1, 1), the storage capacitor Cst of the sub-pixel unit R (1, 1) charges the storage capacitor Cst of the sub-pixel unit R (n−1, m) to make the voltage between the two electrodes of the sub-pixel unit R (n−1, m) be V1. In the display control method, the voltage between the two electrodes of the storage capacitor of the sub-pixel unit R (n−1, m) can be adjusted into V2, where the voltage V2 is a voltage of the storage capacitor Cst of the sub-pixel unit R (1, 1) when the first frame ends, i.e., V2=V1×2=3V. The voltage between the two electrodes of the storage capacitor of the sub-pixel unit R (n, m) can be adjusted similarly. Therefore, the sub-images displayed at the positions of the sub-pixel units R (n−1, m) and R (n, m) in the second frame of display period have brightness close to or same as gray scales of the sub-images displayed at the positions of the sub-pixel units R (1, 1) and R (2, 1) in the first frame of display period, so that a display effect of the first inter-transmission unit is improved.

For example, in the second case, by simultaneously turning on the inter-transmission switching elements of the sub-pixel units R (n−3, m), R (n−2, m) and R (1, 1) and making the voltage between the two electrodes of the storage capacitor of each of the sub-pixel units R (n−3, m) and R (n−2, m) be V1, the voltage between the two electrodes of the storage capacitor of each of the sub-pixel units R (n−3, m) and R (n−2, m) can be adjusted into V2, where the voltage V2 is a voltage of the storage capacitor Cst of the sub-pixel unit R (1, 1) when the first frame ends, i.e., V2=V1×3=3V. The voltage between the two electrodes of the storage capacitor of the sub-pixel unit R (n, m) can be adjusted similarly. Therefore, the sub-images displayed at the positions of the sub-pixel units R (n−3, m), R (n−2, m), R (n−1, m) and R (n, m) in the second frame of display period have brightness close to or same as gray scales of the sub-images displayed at the positions of the sub-pixel units R (1, 1) and R (2, 1) in the first frame of display period, so that the display effect of the first inter-transmission unit is improved.

For example, in the third case, the inter-transmission switching elements of the sub-pixel units R (1, 1), R (2, 1) and R (n, m) are simultaneously turned on, so that the voltage V1 between the two electrodes of the storage capacitor of the sub-pixel unit R (n, m) is 3V. In such case, the voltage V1 between the two electrodes of the storage capacitor of the sub-pixel unit R (n, m) may not be adjusted, because V1 at the moment is equal to an arithmetic mean of the voltage of 2V between the two electrodes of the storage capacitor Cst of the sub-pixel unit R (1, 1) selected as the second inter-transmission unit and the voltage of 4V between the two electrodes of the storage capacitor Cst of the sub-pixel unit R (2, 1) selected as the second inter-transmission unit when the first frame period ends. Optionally, the voltage V1 between the two electrodes of the storage capacitor of the sub-pixel unit R (n, m) can also be adjusted to V2, where V2 is a voltage between the two electrodes of any one of a plurality of storage capacitors Cst of the sub-pixel units selected as the second inter-transmission unit when the first frame period ends, i.e., V2=2V or 4V.

Moreover, each inter-transmission operation, for example, further includes: after adjusting the voltage of the storage capacitor of the at least one sub-pixel unit selected as the first inter-transmission unit into V2, maintaining the voltage V2 unmodified in the remaining time of the one frame period (for example, the second frame period in the above-mentioned embodiments).

It should be noted that in the one frame period, the steps S300 of any two inter-transmission operation are not simultaneously carried out so as to avoid inter-transmission signal crosstalk.

In the display control method of the color display device, which is provided by the above-mentioned embodiment, for example, the at least one sub-pixel unit and the at least another one sub-pixel unit, which are respectively selected as the first inter-transmission unit and the second inter-transmission unit by the same inter-transmission operation, are configured to have the same color. In the above-mentioned display component for color display, a plurality of sub-pixel units connected to the same inter-transmission connection portion via the inter-transmission switching elements are configured to have the same color. However, the present disclosure is not limited thereto. For example, in a case that the display control method provided by the embodiment of the present disclosure is used for a black and white display device (i.e., an achromatic display device), for example, all the sub-pixel units are connected to the same inter-transmission connection element by the respective inter-transmission switching elements without considering the colors of the at least one sub-pixel unit and the at least another one sub-pixel unit, which are respectively selected as the first inter-transmission unit and the second inter-transmission unit by the same inter-transmission operation.

The display control method provided by the embodiment of the present disclosure, for example, further includes:

S500: executing a charging and/or discharging operation on the storage capacitors of the sub-pixel units which are not selected as the first inter-transmission units by the at least one inter-transmission operation in the one frame period.

For example, in the embodiment, the charging and/or discharging operation is executed on the storage capacitors of the sub-pixel units which are not selected as the first inter-transmission units by the at least one inter-transmission operation in the second frame period.

For example, the sub-pixel unit as the first inter-transmission unit is, for example, a portion of a sub-pixel unit array. With respect to the sub-pixel units except the sub-pixel units selected as the first inter-transmission unit (including the sub-pixel unit as the second inter-transmission unit), a display signal can be provided to the storage capacitor of each sub-pixel unit in a point-to-point manner by the control portion 10 to implement charging and/or discharging of the storage capacitor so as to display a frame of complete image in the second frame period.

It can be understood that in the embodiments of the present disclosure, the inter-transmission operation does not need to be executed in each frame period. Moreover, in the frame period in which the inter-transmission operation is executed, not every pixel is related to the inter-transmission operation. For example, one second includes 60 frame periods, i.e., a first frame period to a 60th frame period. Each period is 1/60 seconds. In these 60 frame periods, for example, only two inter-transmission operations are executed in the second frame period. For example, the two inter-transmission operations are executed in order to achieve an effect of translating the sub-images at the positions of the sub-pixel units R (1, 1) and R (2, 1) in the first frame period to the positions of the sub-pixel units R (n−1, m) and R (n, m) in the second frame period for display. In such case, in the second frame period, operations such as writing external data, erasing original data or maintaining unchanged, can be further executed on the sub-pixel units except the sub-pixel units R (n−1, m) and R (n, m). Therefore, all the sub-pixels display one frame of complete image together in a third frame period. For the frame periods except for the second frame period, whether the inter-transmission operation is executed or not is not limited therein.

Although the display control method is described by taking a plurality of red sub-pixels as example in the above-mentioned embodiment, it can be understood that a plurality of green sub-pixels can also implement inter-transmission between the sub-pixels by using the display control method provided by the embodiment of the present disclosure, and a plurality of blue sub-pixels can also implement inter-transmission between the sub-pixels by using the display control method provided by the embodiment of the present disclosure.

Moreover, in the display control method provided by the embodiment of the present disclosure, unless specifically defined, the sequence of respective steps/sub-steps can be changed.

The embodiments of the present disclosure provide the display component and/or the display device, including the base substrate, and a plurality of sub-pixel units arranged in a matrix, the inter-transmission connection portion and the control portion which are formed on the base substrate, wherein each sub-pixel unit includes the storage capacitor and the inter-transmission switching element; in each sub-pixel unit, the storage capacitor is connected to the inter-transmission connection portion via the inter-transmission switching element; the control portion is configured to include: one or a plurality of processors, one or a plurality of storages and a computer program instruction stored in the storage; and when the computer program instruction is operated by the processor, each step and/or sub-step of the display control method provided by the embodiment above is executed.

Although the disclosure has been described above in great detail with general descriptions and specific embodiments, on the basis of the embodiments of the disclosure, various modifications or improvements can be made, which is apparent to those skilled in the art. Therefore, all such modifications or improvements without departing from the spirit of the disclosure are within the scope of the claims of the disclosure.

The present application claims priority of the Chinese Patent Application No. 201611072432.9 filed on Nov. 29, 2016, the disclosure of which are incorporated herein by its reference in its entirety as part of the present application.

The invention claimed is:

1. A display component, comprising:
a plurality of sub-pixel units arranged in a matrix;
an inter-transmission connection portion; and
a control portion,
wherein each sub-pixel unit includes a storage capacitor and an inter-transmission switching element, in each sub-pixel unit, the storage capacitor is connected to the inter-transmission connection portion via the inter-transmission switching element,
the control portion is configured to execute at least one inter-transmission operation in one frame period, and each inter-transmission operation includes:
selecting at least one sub-pixel unit as a first inter-transmission unit;
selecting at least another one sub-pixel unit as a second inter-transmission unit;
in case of the inter-transmission switching elements of the first inter-transmission unit and the second inter-transmission unit not being simultaneously turned on, controlling the storage capacitor of the at least one sub-pixel unit selected as the first inter-transmission unit to discharge, so that the storage capacitor of the at least one sub-pixel selected as the first inter-transmission unit has a third voltage, and the third voltage is smaller than a voltage of the storage capacitor of the at least another one sub-pixel unit selected as the second inter-transmission unit to display a sub-image displayed in a previous frame period of the one frame period; and
then simultaneously turning on the inter-transmission switching elements of the sub-pixel units selected as the first inter-transmission unit and the second inter-transmission unit, so that the storage capacitor of the at least another one sub-pixel unit selected as the second inter-transmission unit charges the storage capacitor of the at least one sub-pixel unit selected as the first inter-transmission unit by the inter-transmission connection portion to have a first voltage to display a sub-image displayed in the one frame period,
the display component further comprises a adjusting unit, the control portion being further configured to adjust the storage capacitor of the at least one sub-pixel unit selected as the first inter-transmission unit by the adjusting unit to have a second voltage, the adjusting unit comprises a capacitor and a transistor, the adjusting unit is provided with input terminals and an output terminal, one electrode of the capacitor as the output terminal of the adjusting unit is directly connected to the inter-transmission connection portion, another electrode of the capacitor is connected to a source electrode of the transistor, a gate electrode of the transistor and a drain electrode of the transistor as the input terminals are connected to the control portion respectively.

2. The display component according to claim 1, wherein the control portion is configured to execute the selecting at least one sub-pixel unit as the first inter-transmission unit and the selecting at least another one sub-pixel unit as the second inter-transmission unit by performing analysis on a frame image signal of the one frame period and a frame image signal of a previous frame period adjacent to the one frame period, wherein the sub-image displayed in the previous frame period of the one frame period by the second inter-transmission unit and a sub-image displayed in the one frame period by the first inter-transmission unit belong to a same position of a same pattern.

3. The display component according to claim 2, further comprising a adjusting unit, the control portion being further configured to adjust the storage capacitor of the at least one sub-pixel unit selected as the first inter-transmission unit by the adjusting unit to have a second voltage.

4. The display component according to claim 3, wherein the adjusting unit is provided with an input terminal and an output terminal, the input terminal is connected to the control portion, and the output terminal is directly connected to the inter-transmission connection portion.

5. The display component according to claim 3, wherein a number of the at least one sub-pixel unit selected as the first inter-transmission unit is N, and a number of the at least another one sub-pixel unit selected as the second inter-transmission unit is 1, wherein $V2=V1\times(N+1)$, where V1 represents the first voltage, V2 represents the second voltage, and N is a natural number.

6. The display component according to claim 1, wherein a number of the at least one sub-pixel unit selected as the first inter-transmission unit is N, and a number of the at least another one sub-pixel unit selected as the second inter-transmission unit is 1, wherein $V2=V1\times(N+1)$, where V1 represents the first voltage, V2 represents the second voltage, and N is a natural number.

7. The display component according to claim 1, wherein the plurality of sub-pixel units is formed on a base substrate, and the base substrate is a monocrystalline silicon chip.

8. The display component according to claim 1, wherein each sub-pixel unit further includes a driving transistor and an Organic Light-Emitting Diode (OLED) element, the driving transistor is connected to the OLED element, and the storage capacitor is configured to maintain a gate voltage of the driving transistor.

9. The display component according to claim 1, wherein the control portion is further configured to execute a charging and/or discharging operation on the storage capacitors of the sub-pixel units which are not selected as the first inter-transmission unit by the at least one inter-transmission operation in the one frame period.

10. The display component according to claim 1, wherein the control portion is further configured to control charge or discharge of the storage capacitor of each sub-pixel unit in a point-to-point manner.

11. A display device, comprising the display component according to claim 1.

12. A display control method of a display device, wherein the display device includes a plurality of sub-pixel units arranged in a matrix and an inter-transmission connection portion, wherein each sub-pixel unit includes a storage capacitor and an inter-transmission switching element, and in each sub-pixel unit, the storage capacitor is connected to the inter-transmission connection portion via the inter-transmission switching element, the display control method comprising: executing at least one inter-transmission operation in one frame period, each inter-transmission operation including:

selecting at least one sub-pixel unit as a first inter-transmission unit;

selecting at least another one sub-pixel unit as a second inter-transmission unit;

in case of the inter-transmission switching elements of the first inter-transmission unit and the second inter-transmission unit not being simultaneously turned on, controlling the storage capacitor of the at least one sub-pixel unit selected as the first inter-transmission unit to discharge, so that the storage capacitor of the at least one sub-pixel selected as the first inter-transmission unit has a third voltage, and the third voltage is smaller than a voltage of the storage capacitor of the at least another one sub-pixel unit selected as the second inter-transmission unit to display a sub-image displayed in a previous frame period of the one frame period; and then simultaneously turning on the inter-transmission switching elements of the sub-pixel units selected as the first inter-transmission unit and the second inter-transmission unit, so that the storage capacitor of the at least another one sub-pixel unit selected as the second inter-transmission unit charges the storage capacitor of the at least one sub-pixel unit selected as the first inter-transmission unit to have a first voltage to display a sub-image displayed in the one frame period, the display component further comprises a adjusting unit, the control portion being further configured to adjust the storage capacitor of the at least one sub-pixel unit selected as the first inter-transmission unit by the adjusting unit to have a second voltage, the adjusting unit comprises a capacitor and a transistor, the adjusting unit is provided with input terminals and an output terminal, one electrode of the capacitor as the output terminal of the adjusting unit is directly connected to the inter-transmission connection portion, another electrode of the capacitor is connected to a source electrode of the transistor, a gate electrode of the transistor and a drain electrode of the transistor as the input terminals are connected to the control portion respectively.

13. The display control method according to claim 12, wherein the selecting at least one sub-pixel unit as the first inter-transmission unit and the selecting at least another one sub-pixel unit as the second inter-transmission unit are executed by analyzing a frame image signal of the one frame period and a frame image signal of a previous frame period adjacent to the one frame period, wherein the sub-image displayed in the previous frame period of the one frame period by the second inter-transmission unit and the sub-image displayed in the one frame period by the first inter-transmission unit belong to a same position of a same pattern.

14. The display control method according to claim 12, wherein each inter-transmission operation further includes: after simultaneously turning on the inter-transmission switching elements selected as the first inter-transmission unit and the second inter-transmission unit, adjusting the storage capacitor of the at least one sub-pixel unit selected as the first inter-transmission unit to have a second voltage.

15. The display control method according to claim 14, wherein a number of the at least one sub-pixel unit selected as the first inter-transmission unit is N, and a number of the at least another one sub-pixel unit selected as the second inter-transmission unit is 1, wherein V2=V1×(N+1), where V1 represents the first voltage, V2 represents the second voltage, and N is a natural number.

16. The display control method according to claim 14, wherein each inter-transmission operation further includes: after adjusting the storage capacitor of the at least one sub-pixel unit selected as the first inter-transmission unit to have the second voltage, maintaining the second voltage unmodified in remaining time of the one frame period.

17. The display control method according to claim 12, further comprising: executing a charging and/or discharging operation on the storage capacitors of the sub-pixel units which are not selected as the first inter-transmission units by the at least one inter-transmission operation in the one frame period.

18. The display control method according to claim 12, wherein each sub-pixel unit further includes a driving transistor and an OLED element, a drain electrode of the driving transistor is connected to the OLED element, and the storage capacitor is configured to maintain a gate voltage of the driving transistor.

19. A display component, comprising:
a plurality of sub-pixel units arranged in a matrix;
an inter-transmission connection portion; and
a control portion,
wherein each sub-pixel unit includes a storage capacitor and an inter-transmission switching element, in each sub-pixel unit, the storage capacitor is connected to the inter-transmission connection portion via the inter-transmission switching element,
the control portion is configured to execute at least one inter-transmission operation in one frame period, and each inter-transmission operation includes:
selecting at least one sub-pixel unit as a first inter-transmission unit;
selecting at least another one sub-pixel unit as a second inter-transmission unit;
in case of the inter-transmission switching elements of the first inter-transmission unit and the second inter-transmission unit not being simultaneously turned on, controlling the storage capacitor of the at least one sub-pixel unit selected as the first inter-transmission unit to discharge, so that the storage capacitor of the at least one sub-pixel selected as the first inter-transmission unit has a third voltage, and the third voltage is smaller than a voltage of the storage capacitor of the at least another one sub-pixel unit selected as the second inter-transmission unit to display a sub-image displayed in a previous frame period of the one frame period; and
then simultaneously turning on the inter-transmission switching elements of the sub-pixel units selected as the first inter-transmission unit and the second inter-transmission unit, so that the storage capacitor of the at least another one sub-pixel unit selected as the second inter-transmission unit charges the storage capacitor of the at least one sub-pixel unit selected as the first inter-transmission unit by the inter-transmission connection portion to have a first voltage to display a sub-image displayed in the one frame period, the display component further comprises a adjusting unit, the control portion being further configured to adjust the storage capacitor of the at least one sub-pixel unit selected as the first inter-transmission unit by the adjusting unit to have a second voltage, the adjusting unit comprises an magnifier, a resistance element, and a transistor, the adjusting unit is provided with an input terminal and an output terminal, both of one electrode of the capacitor and an output terminal of the magnifier as the output terminal of the adjusting unit are directly connected to the inter-transmission connection portion, both of another electrode of the capacitor and an input terminal of the magnifier are connected to one terminal of the of the resistance element, and another terminal of the resistance element as the input terminal of the adjusting unit is directly connected to the control portion.

* * * * *